United States Patent
Kuo

(10) Patent No.: US 9,042,110 B2
(45) Date of Patent: May 26, 2015

(54) POSITIONING STRUCTURE FOR REMOVABLE HARD DRIVE

(71) Applicant: Chung-I Kuo, Taoyuan Hsien (TW)

(72) Inventor: Chung-I Kuo, Taoyuan Hsien (TW)

(73) Assignee: AIC INC., Taoyuan Hsien (TW)

(*) Notice: Subject to any disclaimer, the term of this patent is extended or adjusted under 35 U.S.C. 154(b) by 170 days.

(21) Appl. No.: 13/656,751

(22) Filed: Oct. 22, 2012

(65) Prior Publication Data

US 2013/0313955 A1    Nov. 28, 2013

(30) Foreign Application Priority Data

May 23, 2012   (TW) .............................. 101209737 U

(51) Int. Cl.
*H05K 5/00*        (2006.01)
*G11B 33/12*       (2006.01)

(52) U.S. Cl.
CPC ............ *G11B 33/124* (2013.01); *H05K 5/0008* (2013.01); *H05K 5/0017* (2013.01)

(58) Field of Classification Search
CPC ......... H05K 5/03; H05K 5/02; H05K 5/0008; H05K 5/0013; G11B 33/128
USPC ................. 312/326, 223.1; 361/756
See application file for complete search history.

(56) References Cited

U.S. PATENT DOCUMENTS

| | | | | |
|---|---|---|---|---|
| 5,788,211 A * | 8/1998 | Astier | ........................... | 248/674 |
| 6,944,013 B2 * | 9/2005 | Yang | ........................ | 361/679.33 |
| 7,200,001 B2 * | 4/2007 | Spychalla | ................ | 361/679.33 |
| 7,203,061 B1 * | 4/2007 | Chen | ........................ | 361/679.34 |
| 7,254,017 B2 * | 8/2007 | Peng et al. | ................ | 361/679.33 |
| 7,613,006 B2 * | 11/2009 | Kuo | ................................. | 361/756 |
| 8,004,830 B2 * | 8/2011 | Lu | ........................... | 361/679.33 |
| 8,111,509 B2 * | 2/2012 | Lee | ........................ | 361/679.33 |
| 8,289,693 B2 * | 10/2012 | Li | ............................. | 361/679.34 |
| 8,297,574 B2 * | 10/2012 | Zhang et al. | ............. | 248/221.11 |
| 8,553,404 B2 * | 10/2013 | Lin et al. | ................... | 361/679.33 |
| 2004/0173544 A1 * | 9/2004 | Chen | ................................ | 211/26 |
| 2010/0165564 A1 * | 7/2010 | Lu | ........................... | 361/679.35 |
| 2013/0070414 A1 * | 3/2013 | Zhang et al. | ............. | 361/679.33 |
| 2014/0153166 A1 * | 6/2014 | Mao et al. | ................ | 361/679.01 |

* cited by examiner

*Primary Examiner* — Lisa Lea Edmonds
*Assistant Examiner* — Keith Depew
(74) *Attorney, Agent, or Firm* — Chun-Ming Shih; HDLS IPR Services

(57) ABSTRACT

A positioning structure for a removable hard drive includes an enclosure and a tray. The enclosure is used for being mounted by the hard drive, and disposed with a plurality of positioning holes. The tray includes a bottom and two side walls vertically extending therefrom. A space being is formed by the bottom and the side walls. The bottom is formed with a plurality of positioning pillars corresponding to the positioning holes. The enclosure is received in the space, and the positioning holes are correspondingly inserted by the positioning pillars.

5 Claims, 6 Drawing Sheets

POSITIONING STRUCTURE FOR REMOVABLE HARD DRIVE

This application is based on and claims the benefit of Taiwan Application No. 101209737 filed May 23, 2012 the entire disclosure of which is incorporated by reference herein.

BACKGROUND OF THE INVENTION

1. Technical Field

The invention relates to a fixture of data storage device, particularly to a fixture of removable hard drive rack.

2. Related Art

With popularization of computers, many kinds of peripheral devices appear in the markets to satisfy user's requirements, for example, a removable hard drive for data storage (installed in a removable hard drive rack). Because of the advantages of plug-and-play and capability for storage of a bulky amount of data, the removable hard drive has been widely adopted by users.

Such a removable hard drive rack can allow a hard drive to be directly detached from a computer case without disassembly. It is more convenient than conventional installation of hard drives.

However, current removable hard drive racks usually require a hand tool to fasten screws into a case. On the other hand, to remove the hard drive, the hand tool is still required. Because the screws are symmetrically fastened to two opposite sides of the removable hard drive rack, difficulty of positioning and asymmetry of fastening forces happens frequently. Moreover, the disassembled screws are hard to be kept and a hand tool is required when installing and disassembling, these will cause complication and inconvenience.

SUMMARY OF THE INVENTION

An object of the invention is to provide a positioning structure for a removable hard drive which has an advantage of easy installation and positioning.

Another object of the invention is to provide a positioning structure for a removable hard drive which does not require any hand tool when installing and positioning and can avoid loss of screws.

To achieve the above objects, the positioning structure of the invention includes an enclosure and a tray. The enclosure is used for being mounted by the hard drive, and disposed with a plurality of positioning holes. The tray includes a bottom and two side walls vertically extending therefrom. A space is formed by the bottom and the side walls. The bottom is formed with a plurality of positioning pillars corresponding to the positioning holes. The enclosure is received in the space, and the positioning holes are correspondingly inserted by the positioning pillars.

DETAILED DESCRIPTION OF THE INVENTION

Figure 1:
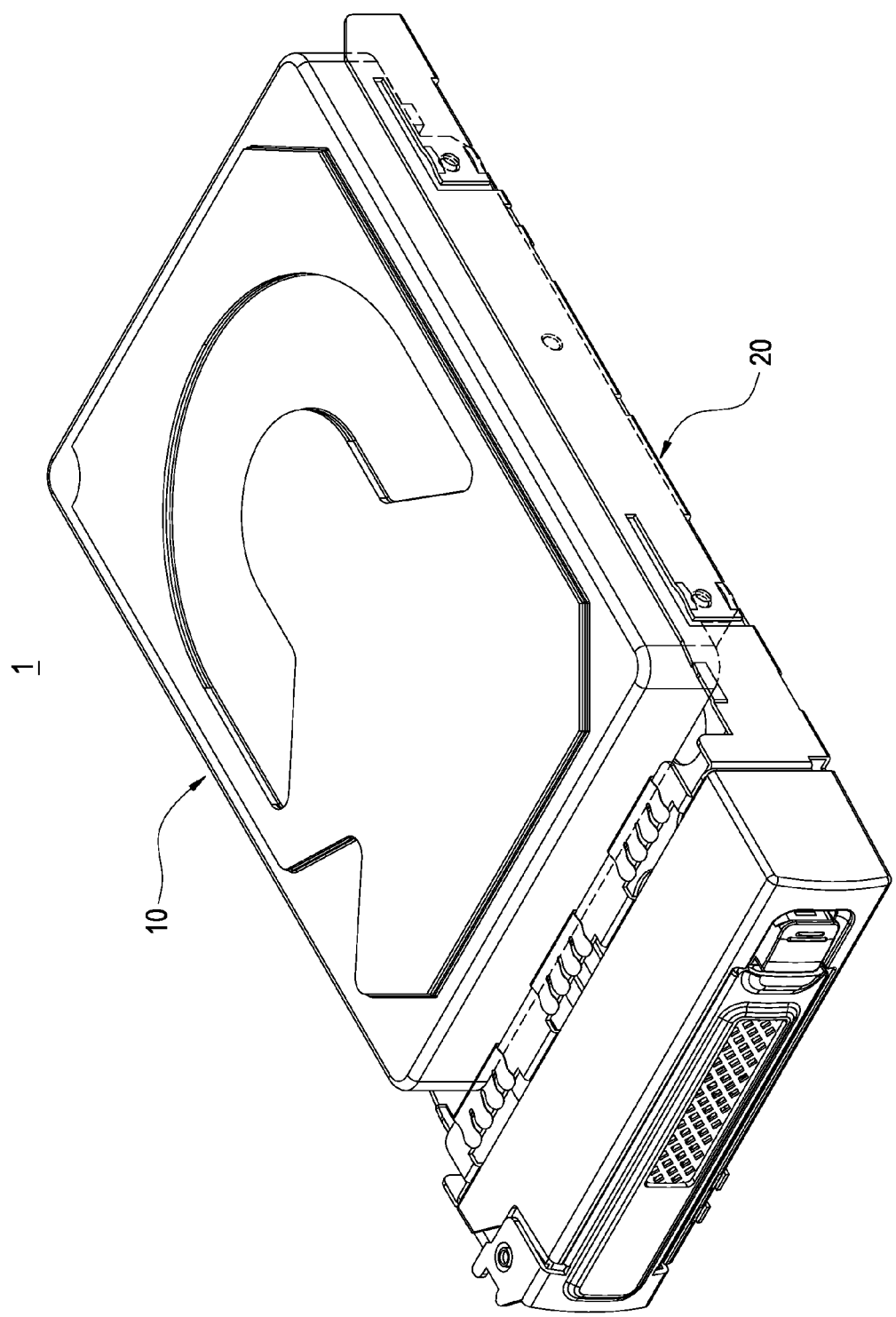
FIG. 1 is a perspective view of the invention.

Please refer to FIG. 1. The positioning structure 1 for a removable hard drive of the invention includes an enclosure 10 and a tray 20. The enclosure 10 is received in the tray 20.

Figure 2:
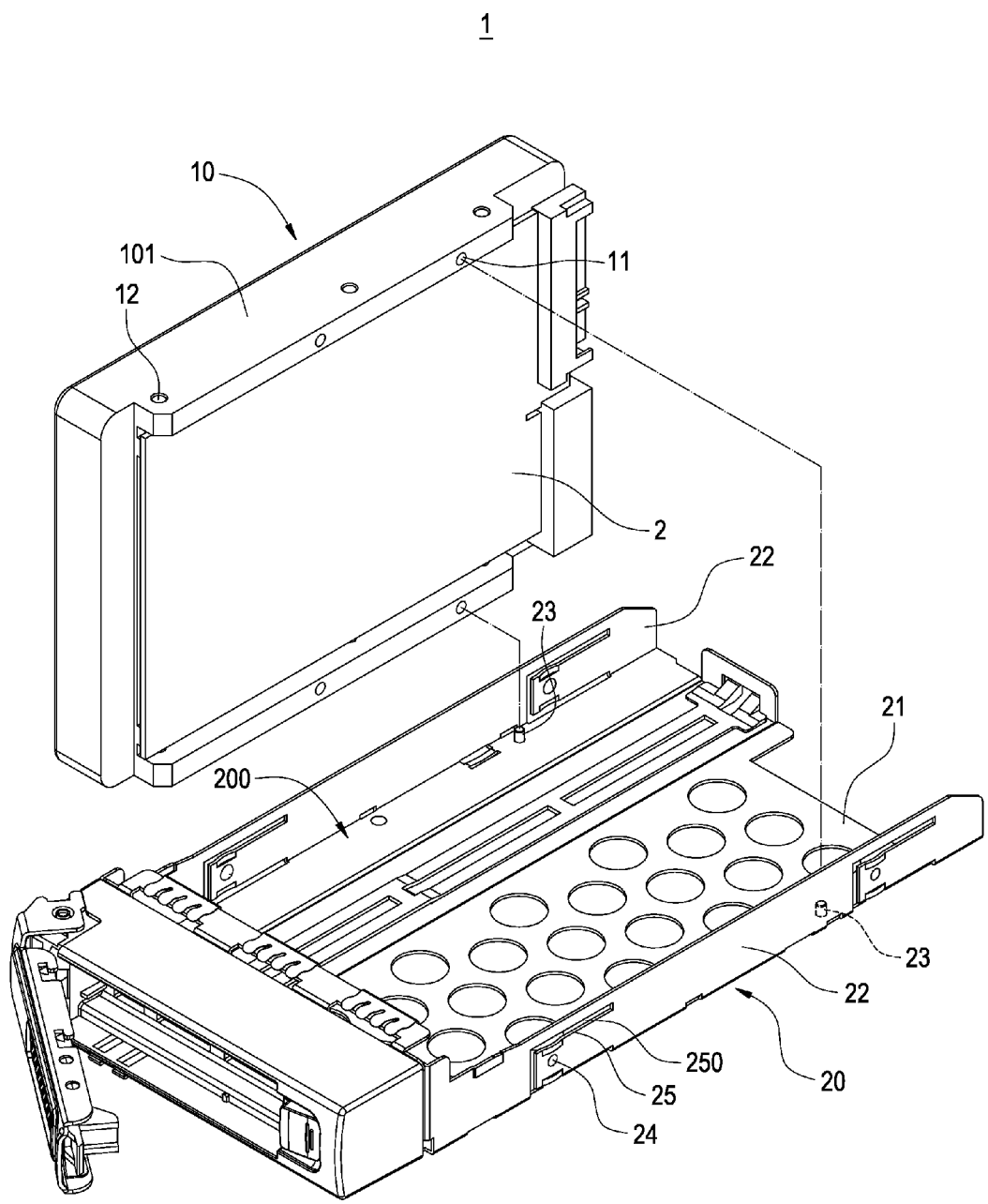
FIG. 2 is an exploded view of the invention.

Please refer to FIG. 2. A hard drive 2 is mounted in the enclosure 10. The bottom of the enclosure 10 is provided with a plurality of positioning holes 11.

The tray 20 includes a bottom 21 and two side walls 22 vertically extending from the bottom 21. A space 200 is formed by the bottom 21 and the side walls 22. The bottom 21 is formed with a plurality of positioning pillars 23 corresponding to the positioning holes 11. The enclosure 10 is received in the space 200 and the positioning holes 11 are correspondingly engaged with the positioning pillars 23.

In a preferred embodiment of the invention, a side 101 of the enclosure 10 is formed with at least one positioning cavity 12. One of the side walls 22 is formed with at least one positioning protrusion 24. In the embodiment, each of the side walls 22 has an elastic arm 25 and a slot 250 in which the elastic arm 25 is formed. The positioning protrusion 24 is located on an inner side of the side wall 22.

Figure 3:
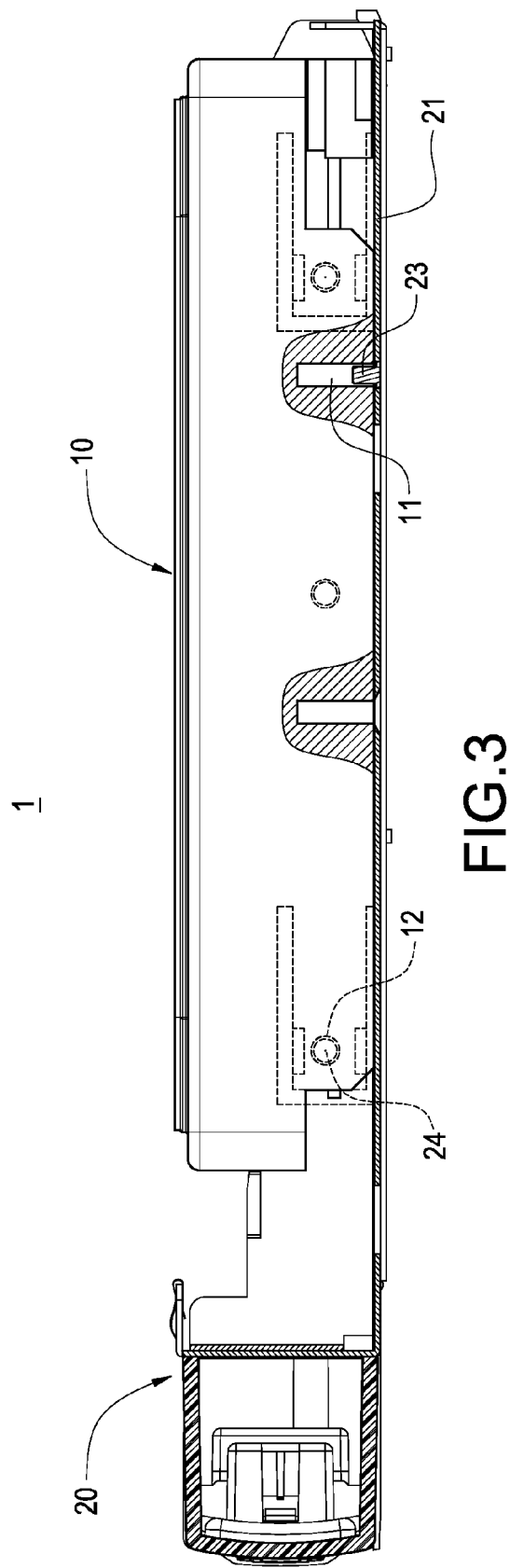
FIG. 3 is a cross-sectional view of the invention.

Please refer to FIG. 3. In the embodiment, the positioning holes 11 are circular holes and the positioning pillars 23 are cylinders. The positioning pillars 23 are slightly smaller than the positioning holes 11 in diameter so that the positioning pillars 23 can be received in the positioning holes 11.

Figure 4:
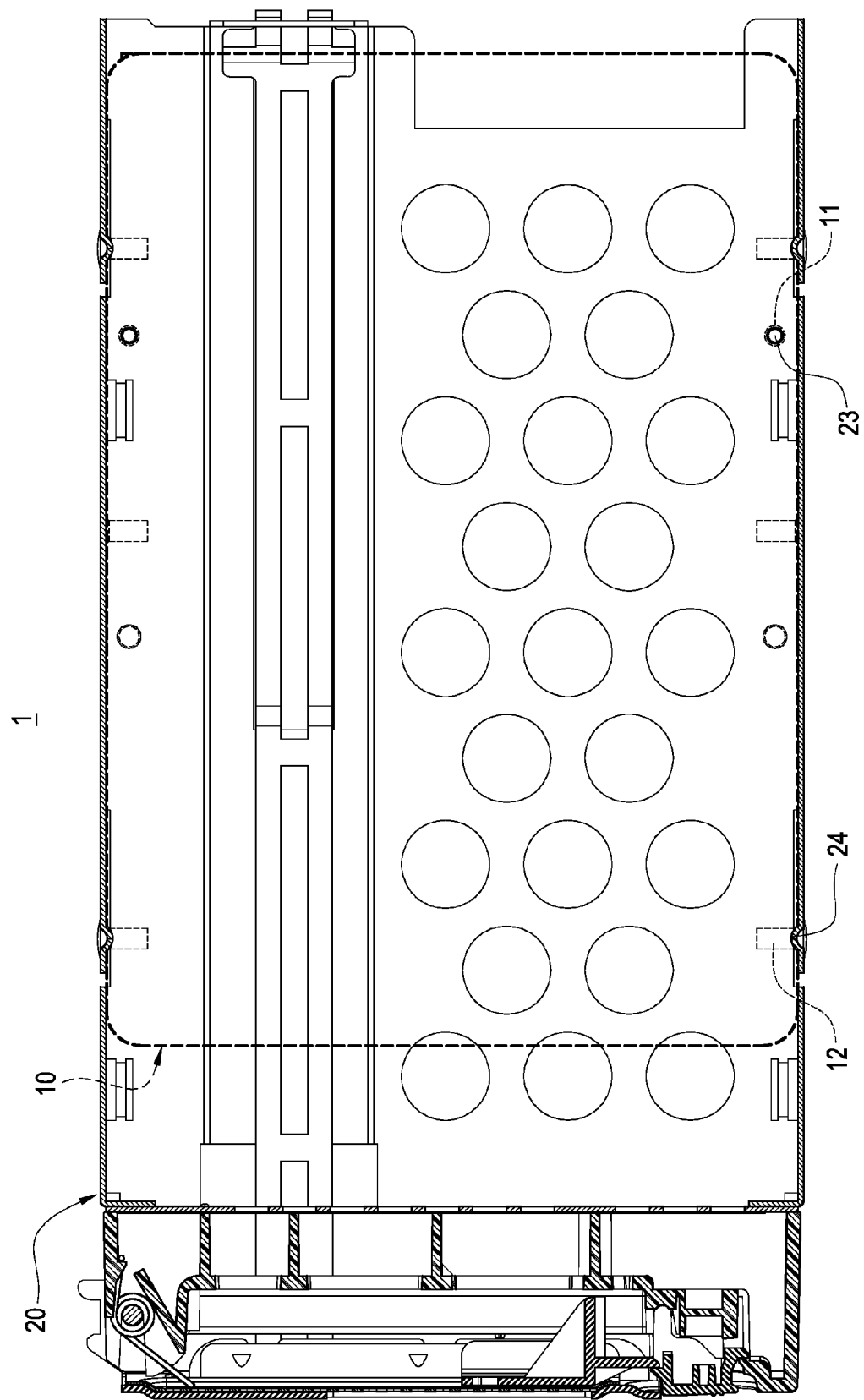
FIG. 4 is another cross-sectional view of the invention.

Please refer to FIG. 4. Preferably, the positioning cavity 12 has a circular opening and the positioning protrusion 24 is a convex body. The positioning cavity 12 is engaged with the positioning protrusion 24.

Figure 5:
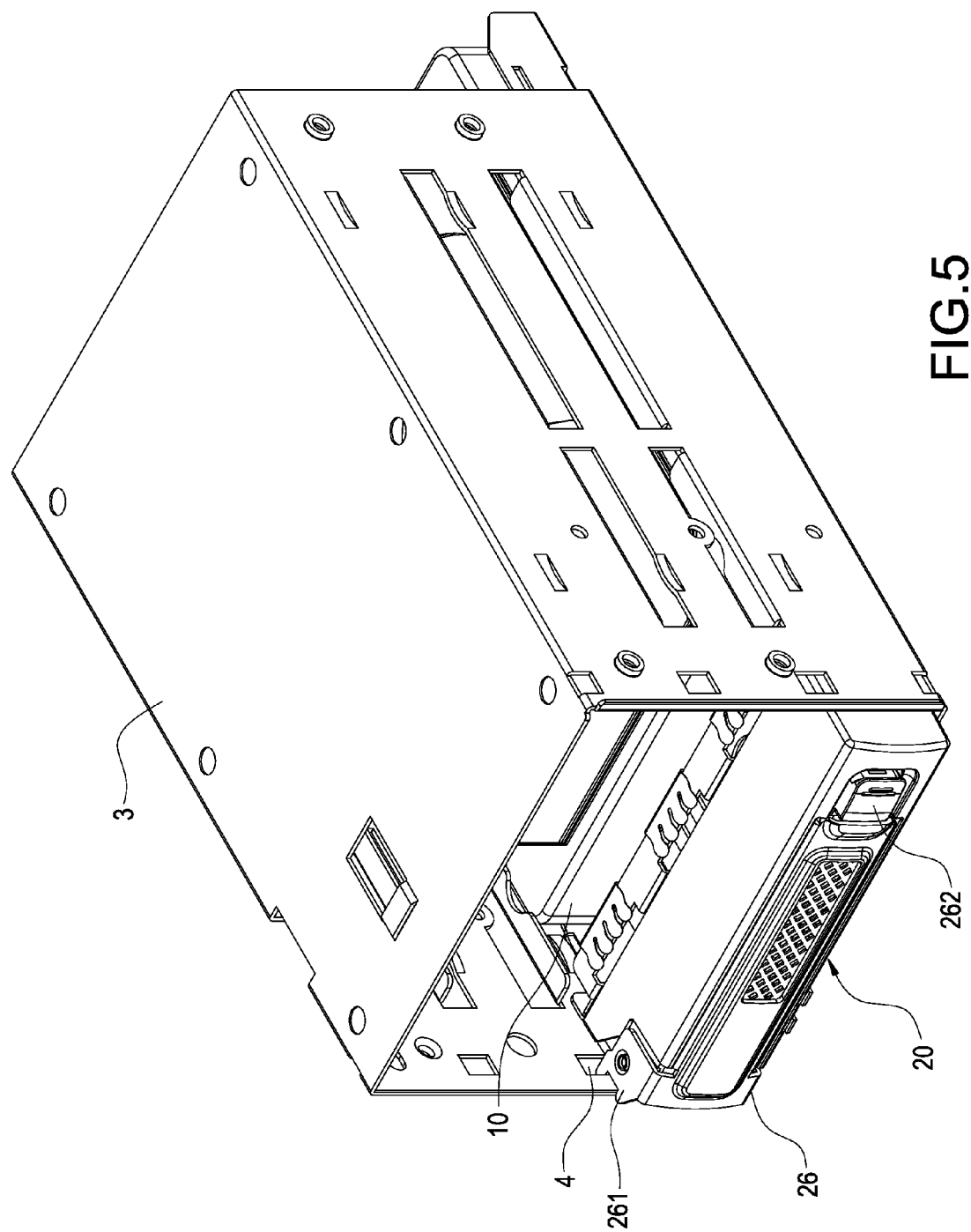
FIG. 5 is a schematic view of the invention in use.

Please refer to FIG. 5. The invention can detachably fasten the tray 20 with a hard drive 2 into a case 3.

The case 3 has an engagement hole 4 and the tray 20 has a rotatable cover 26. A side of the rotatable cover 26 is provided with an engagement sheet 261. The tray 20 can be fixed in the case 3 by engaging the engagement sheet 261 with the engagement hole 4.

Figure 6:
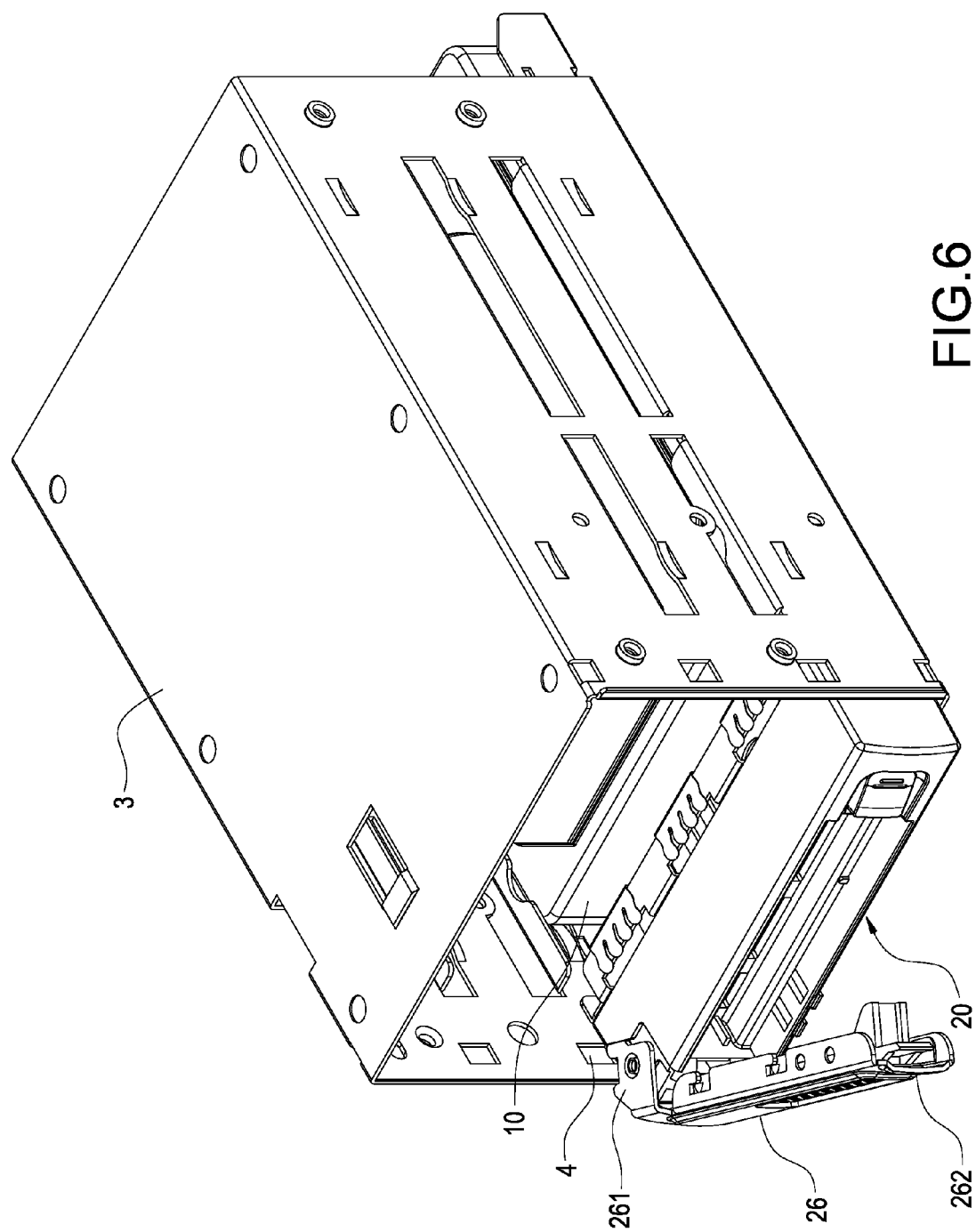
FIG. 6 is another schematic view of the invention in use.

Please refer to FIG. 6. In a preferred embodiment of the invention, the rotatable cover 26 of the tray 20 is further provided with a push-button 262. The rotatable cover 26 will open to a side of the tray 20 and the engagement sheet 261 will be disconnected from the engagement hole 4 when the push-button 262 is pressed. At this time, the tray 20 can be removed from the case 3.

It will be appreciated by persons skilled in the art that the above embodiment has been described by way of example only and not in any limitative sense, and that various alterations and modifications are possible without departure from the scope of the invention as defined by the appended claims.

What is claimed is:

1. A positioning structure for a removable hard drive detachably installed in a case, comprising:
    an enclosure having an accommodating space formed by a front end, a back end and two first side walls, wherein each first side wall has a first bottom surface, each first bottom surface is provided with a plurality of positioning holes, the hard drive is accommodated in the accommodating space, and an outer side surface of each first side wall of the enclosure is formed with at least one positioning cavity; and
    a tray, including a second bottom surface and two second side walls vertically extending therefrom, a space being formed by the second bottom surface and the two second side walls, and the second bottom surface being formed with a plurality of positioning pillars corresponding to the positioning holes, and the second bottom surface being directly in contact with each first bottom surface, each of the second side walls having a cutout to form at least one elastic arm on each second side wall, the at least one elastic arm integrally formed with the second side walls as one piece;

wherein a free end of the at least one elastic arm has two sides surfaces opposite to each other, one of the two side surfaces facing the space is integrally formed a convex body protruded toward the space to form at least one positioning protrusion, the enclosure is received and positioned in the space by engaging the at least one positioning protrusion with the at least one positioning cavity and correspondingly inserting the plurality of the positioning pillars into the plurality of the positioning holes, wherein a surface of the positioning protrusion contacting the positioning cavity is formed as a cambered surface, such that the enclosure can be detached from the tray by directly pulling the enclosure upwardly, and wherein the other one of the two side surfaces opposite to the space has a protrusion protruded toward a case to be against the case when the tray is installed in the case.

2. The positioning structure of claim 1, wherein the positioning holes are circular, the positioning pillars are cylindrical, and the positioning pillars are slightly smaller than the positioning holes in diameter.

3. The positioning structure of claim 1, wherein the at least one positioning cavity is circular, and the at least one positioning protrusion is a convex body.

4. The positioning structure of claim 1, wherein the case is provided with an engagement hole, the tray has a rotatable cover, and a side of the rotatable cover has an engagement sheet engaging with the engagement hole.

5. The positioning structure of claim 4, wherein the rotatable cover further has a push-button, the rotatable cover will open to a side of the tray and the engagement sheet will be disconnected from the engagement hole when the push-button is pressed.

* * * * *